United States Patent
Bongiovi et al.

(10) Patent No.: US 8,462,963 B2
(45) Date of Patent: *Jun. 11, 2013

(54) SYSTEM AND METHOD FOR PROCESSING AUDIO SIGNAL

(75) Inventors: Anthony Bongiovi, Port St. Lucie, FL (US); Phillip Fuller, New York, NY (US)

(73) Assignee: Bongiovi Acoustics, LLCC, Port St. Lucie, FL (US)

( * ) Notice: Subject to any disclaimer, the term of this patent is extended or adjusted under 35 U.S.C. 154(b) by 1299 days.

This patent is subject to a terminal disclaimer.

(21) Appl. No.: 12/048,885

(22) Filed: Mar. 14, 2008

(65) Prior Publication Data

US 2008/0219459 A1    Sep. 11, 2008

Related U.S. Application Data

(63) Continuation-in-part of application No. 11/764,446, filed on Jun. 18, 2007, now Pat. No. 7,519,189, which is a continuation of application No. 10/914,234, filed on Aug. 10, 2004, now Pat. No. 7,254,243, said application No. 12/048,885 is a continuation-in-part of application No. 11/947,301, filed on Nov. 29, 2007, now Pat. No. 8,160,274, which is a continuation-in-part of application No. 11/703,216, filed on Feb. 7, 2007, now abandoned.

(60) Provisional application No. 60/861,711, filed on Nov. 30, 2006, provisional application No. 60/765,722, filed on Feb. 7, 2006.

(51) Int. Cl.
*H03G 5/00* (2006.01)

(52) U.S. Cl.
USPC .......... 381/98; 381/99; 381/57; 381/103; 381/104; 381/106

(58) Field of Classification Search
USPC .............. 381/102–109, 57, 98–99
See application file for complete search history.

(56) References Cited

U.S. PATENT DOCUMENTS

| 4,162,462 A | 7/1979 | Endoh et al. |
| 4,184,047 A | 1/1980 | Langford |
| 4,353,035 A | 10/1982 | Schroeder |
| 4,356,558 A | 10/1982 | Owen et al. |
| 4,363,007 A | 12/1982 | Haramoto et al. |
| 4,517,415 A * | 5/1985 | Laurence ............ 381/317 |
| 4,538,297 A | 8/1985 | Waller |
| 4,584,700 A | 4/1986 | Scholz |
| 4,612,665 A | 9/1986 | Inami et al. |
| 4,677,645 A | 6/1987 | Kaniwa et al. |
| 4,696,044 A | 9/1987 | Waller, Jr. |
| 4,701,953 A | 10/1987 | White |

(Continued)

FOREIGN PATENT DOCUMENTS

| AU | 2005274099 | 10/2010 |
| JP | 3150910 | 6/1991 |

(Continued)

*Primary Examiner* — Disler Paul
(74) *Attorney, Agent, or Firm* — Malloy & Malloy, P.L.

(57) ABSTRACT

The present invention provides for methods and systems for digitally processing an audio signal. Specifically, the present invention provides for a speaker system that is configured to digitally process an audio signal in a manner such that studio-quality sound that can be reproduced.

18 Claims, 7 Drawing Sheets

U.S. PATENT DOCUMENTS

| | | | |
|---|---|---|---|
| 4,704,726 A | 11/1987 | Gibson | |
| 4,739,514 A | 4/1988 | Short et al. | |
| 4,815,142 A | 3/1989 | Imreh | |
| 4,856,068 A | 8/1989 | Quatieri, Jr. et al. | |
| 4,887,299 A | 12/1989 | Cummins et al. | |
| 5,133,015 A | 7/1992 | Scholz | |
| 5,210,806 A | 5/1993 | Kihara et al. | |
| 5,361,381 A | 11/1994 | Short | |
| 5,463,695 A | 10/1995 | Werrbach | |
| 5,465,421 A | 11/1995 | McCormick et al. | |
| 5,572,443 A | 11/1996 | Emoto et al. | |
| 5,617,480 A | 4/1997 | Ballard et al. | |
| 5,640,685 A | 6/1997 | Komoda | |
| 5,699,438 A | 12/1997 | Smith et al. | |
| 5,832,097 A * | 11/1998 | Armstrong et al. | 381/321 |
| 5,872,852 A | 2/1999 | Dougherty | |
| 5,990,955 A | 11/1999 | Koz | |
| 6,078,670 A | 6/2000 | Beyer | |
| 6,108,431 A * | 8/2000 | Bachler | 381/312 |
| 6,201,873 B1 * | 3/2001 | Dal Farra | 381/100 |
| 6,263,354 B1 | 7/2001 | Gandhi | |
| 6,285,767 B1 | 9/2001 | Klayman | |
| 6,292,511 B1 | 9/2001 | Goldston et al. | |
| 6,317,117 B1 | 11/2001 | Goff | |
| 6,318,797 B1 | 11/2001 | Bohm et al. | |
| 6,535,846 B1 | 3/2003 | Shashoua | |
| 6,871,525 B2 | 3/2005 | Withnall et al. | |
| 6,907,391 B2 | 6/2005 | Bellora et al. | |
| 7,006,653 B2 | 2/2006 | Guenther | |
| 7,016,746 B2 | 3/2006 | Wiser et al. | |
| 7,058,463 B1 | 6/2006 | Ruha et al. | |
| 7,123,728 B2 | 10/2006 | King et al. | |
| 7,254,243 B2 | 8/2007 | Bongiovi | |
| 7,266,205 B2 | 9/2007 | Miller | |
| 7,274,795 B2 | 9/2007 | Bongiovi | |
| 2003/0035555 A1 | 2/2003 | King et al. | |
| 2003/0112088 A1 | 6/2003 | Bizjak | |
| 2003/0216907 A1 | 11/2003 | Thomas | |
| 2004/0022400 A1 | 2/2004 | Magrath | |
| 2004/0086144 A1 | 5/2004 | Kallen | |
| 2004/0146170 A1 | 7/2004 | Zint | |
| 2005/0201572 A1 | 9/2005 | Lindahl et al. | |
| 2005/0249272 A1 | 11/2005 | Kirkeby et al. | |
| 2005/0254564 A1 | 11/2005 | Tsutsui | |
| 2006/0034467 A1 | 2/2006 | Sleboda et al. | |
| 2006/0098827 A1 | 5/2006 | Paddock et al. | |
| 2006/0126865 A1 * | 6/2006 | Blamey et al. | 381/102 |
| 2006/0291670 A1 | 12/2006 | King et al. | |
| 2007/0223717 A1 | 9/2007 | Gunness | |
| 2007/0253577 A1 | 11/2007 | Yen et al. | |
| 2008/0112576 A1 | 5/2008 | Bongiovi | |
| 2008/0123870 A1 * | 5/2008 | Stark et al. | 381/86 |
| 2009/0086996 A1 * | 4/2009 | Bongiovi et al. | 381/106 |
| 2009/0296959 A1 * | 12/2009 | Bongiovi | 381/103 |

FOREIGN PATENT DOCUMENTS

| | | |
|---|---|---|
| JP | 2007-106876 | 4/1995 |
| JP | 2005-500768 | 1/2005 |
| WO | WO 2006/020427 A2 | 2/2006 |
| WO | WO 2007/092420 A2 | 8/2007 |

\* cited by examiner

SYSTEM AND METHOD FOR PROCESSING AUDIO SIGNAL

CROSS-REFERENCE TO RELATED APPLICATIONS

This application is a continuation-in-part of, and claims priority to U.S. application Ser. No. 11/764,446, filed Jun. 18, 2007 now U.S. Pat. No. 7,519,189, which is a continuation of U.S. patent application Ser. No. 10/914,234 filed Aug. 10, 2004 now U.S. Pat. No. 7,254,243. This application is also a continuation-in-part of and claims priority to U.S. application Ser. No. 11/947,301 filed Nov. 29, 2007 now U.S. Pat. No. 8,160,274 which claims priority to U.S. Provisional Application No. 60/861,711 filed Nov. 30, 2006, and is a continuation-in-part of U.S. application Ser. No. 11/703,216, filed Feb. 7, 2007 now abandoned, which claims priority to U.S. Provisional Application No. 60/765,722, filed Feb. 7, 2006. Each of the above applications is incorporated by reference herein in its entirety.

TECHNICAL FIELD

This invention relates to apparatus for processing an audio signal and, in particular, to apparatus which is particularly useful for presenting enhanced quality sound in a high noise environment.

DESCRIPTION OF THE RELATED

Historically studio-quality sound, which can best be described as the full reproduction of the complete range of audio frequencies that are utilized during the studio recording process, has only been able to be achieved, appropriately, in audio recording studios. Studio-quality sound is characterized by the level of clarity and brightness which is attained only when the upper-mid frequency ranges are effective manipulated and reproduced. Achieving studio-quality sound in high-noise environments, such as moving vehicles, remains particularly challenging. For example, the bass response of a system in such an environment is generally inadequate. While the bass response may be boosted with an equalizer to compensate for this inadequacy, this approach typically causes a muffled treble response, thus diminishing the sound quality. In addition to a muffled treble, bass boosting may undesirably increase the dynamic range of the sound presentation.

Typically, the dynamic range of sound in motion pictures can be created and mixed in an environment the size of a movie theater. Thus the quality of playback of motion picture audio in a small environment, such as a home entertainment area or an automobile, is marginal. In a small environment, audio standing waves often develop, producing an annoying acoustical signal at the frequency of the standing wave. Compensation for such specific standing waves in a given small environment would produce a higher quality audio presentation.

Additionally, in a noisy environment, there is very little audio range between the volume floor set by the noise (typically around 80 dB in moving vehicles) and the volume ceiling set by the physiology of the ear (typically around 110 dB). Increasing the dynamic range of sound presented in a noisy environment may be aesthetically undesirable because the sound level may approach the ear's physiological volume ceiling, resulting in an unpleasant annoying or even painful experience.

Typical consumer sound transducers, such as commercial speakers, are acoustically efficient between approximately 600 and 1,000 cycles. To compensate for the inefficient performance of such transducers outside this range, conventional systems often employ a variety of special speakers and amplifiers that can be quite expensive. For example, attempts have been made to reproduce studio-quality sound outside of the recording studio, those attempts have come at tremendous expense (usually resulting from advanced speaker design, costly hardware, and increased power amplification) and have achieved only mixed results.

Further, the design of audio systems for vehicles involves the consideration of many different factors. The audio system designer selects the position and number of speakers in the vehicle. The desired frequency response of each speaker must also be determined. For example, the desired frequency response of a speaker that is located on the instrument panel may be different than the desired frequency response of a speaker that is located on the lower portion of the rear door panel.

The audio system designer must also consider how equipment variations impact the audio system. For example, an audio system in a convertible may not sound as good as the same audio system in the same model vehicle that is a hard top. The audio system options for the vehicle may also vary significantly. One audio option for the vehicle may include a basic 4-speaker system with 40 watts amplification per channel while another audio option may include a 12-speaker system with 200 watts amplification per channel. The audio system designer must consider all of these configurations when designing the audio system for the vehicle. For these reasons, the design of audio systems is time consuming and costly. The audio system designers must also have a relatively extensive background in signal processing and equalization.

Given those considerations, in order to approach or achieve studio-quality sound in a vehicle historically one would have to provide, for example, upgrades to the factory-installed speakers, and/or the addition of additional components, including woofers, sub-woofers, amplifiers, etc. . . . As such, there is a need for systems and methods that can reproduce studio-quality sound in a vehicle without requiring such upgrades and or additions.

BRIEF SUMMARY OF EMBODIMENTS OF THE INVENTION

The present invention provides a system and method for digitally processing an audio signal in a manner such that studio-quality sound that can be reproduced across essentially the entire spectrum of audio devices. In one implementation, the methods of the present invention comprise: determining a loudness value of an audio signal from a device; adjusting the loudness value of the audio signal based on a comparison of the determined loudness and a threshold value; and altering the loudness of an output signal by an amount that is substantially inverse to the amount adjusted to the audio signal based on the comparison.

In one embodiment, adjusting the loudness may comprise increasing the loudness of the audio signal using an expander if the determined loudness is less than the threshold value. The adjusting the loudness may also comprise reducing the loudness of the audio signal using a limiter if the determined loudness is more than the threshold value. In one embodiment, the loudness of a signal may comprise determining the loudness using a leaky integrator.

In another embodiment, the methods may further comprise filtering the adjusted audio signal such that a signal with a flat power spectral density is produced.

In still another embodiment the methods ma further comprise compressing the filtered signal to Increase the dynamic range of the audio signal; and may also further comprise filtering the compressed signal to obtain a signal having a flat frequency response.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the embodiments attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the invention be limited only by the embodiments and the equivalents thereof.

DETAILED DESCRIPTION OF THE EMBODIMENTS OF THE INVENTION

The present invention is directed toward a system and method for digitally processing an audio signal in a manner such that studio-quality sound that can be reproduced across the entire spectrum of audio devices.

Figure 1A:
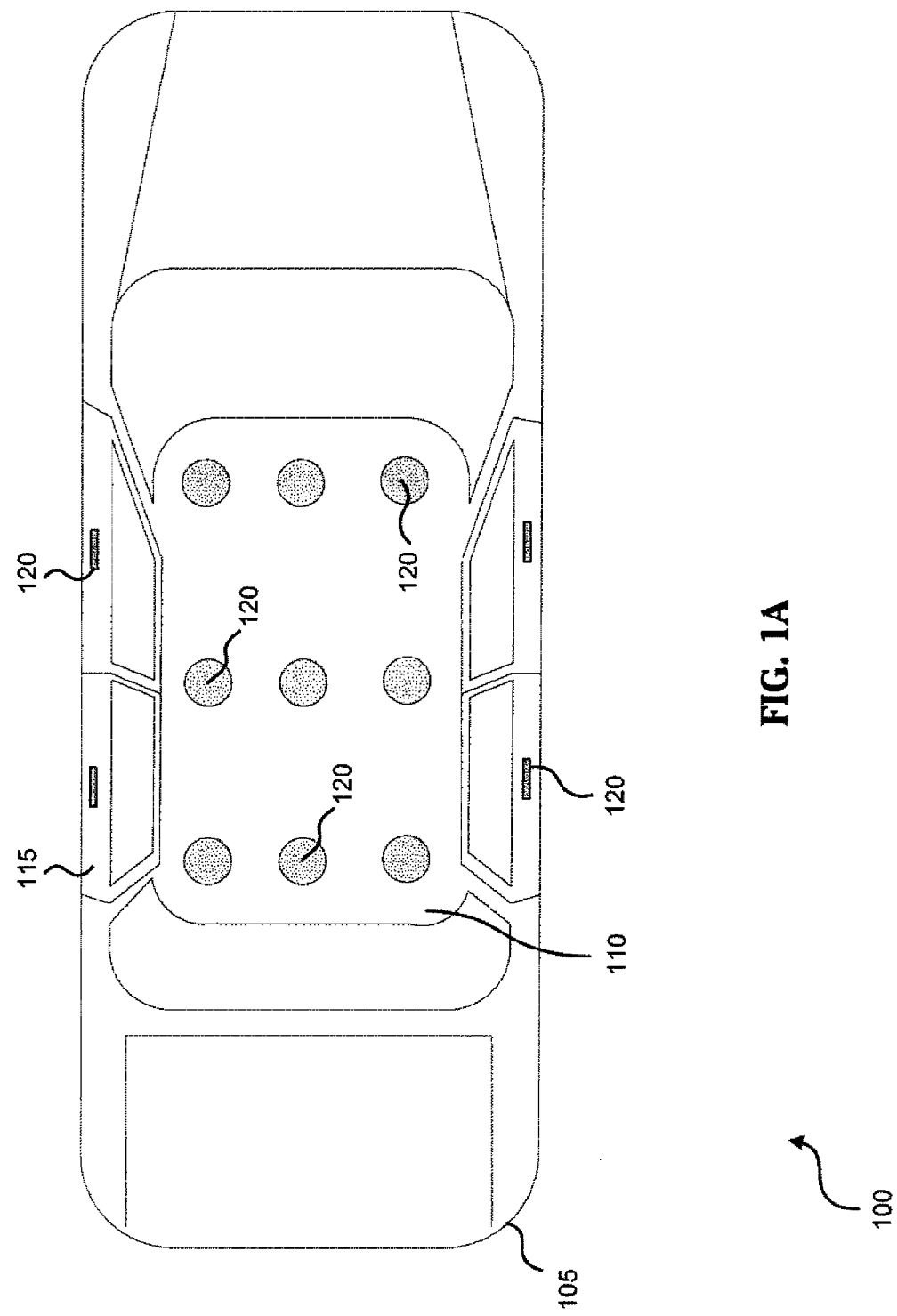
FIGS. 1A-C illustrate example environments in which a method for processing an audio signal according to embodiments of the present invention can be implemented.

Before describing the invention in detail, it is useful to describe a few example environments with which the invention can be implemented. One such example is that of a passenger cabin of a vehicle. FIG. 1A shows an exemplary automotive environment where a panel-speaker system 100, according to an embodiment of the present invention, can be implemented. As shown in FIG. 1A speaker system 100 is located in a vehicle 105. Speaker system 100 includes an array of transducers 120 on a roof panel 110 and door panel 115 of vehicle 105. Although not shown transducers 120 may be positioned in other areas such as, but not limited to kicker panel, trunk, seat back, dashboard, lift gate, firewall, and hood of vehicle 105, etc. In one embodiment, item 120 can also be a conventional speakers speaker having a basket and a cone. Alternatively, system 100 includes a combination of transducers and conventional speakers.

Transducer 120 is an audio drive motor configured to convert electrical signals into mechanical energy or vibrations. The mechanical energy or vibrations produced by transducer 120 are transferred to roof panel 110 which in turns transmit the mechanical energy to a passenger cabin as sound. Transducer 120 is generally flat and has no protruded part like a cone or a basket of a conventional speaker. Thus transducer 120 is relatively safe for use in various consumer environments and small spaces such as automobiles, boats, airplanes, trains, and furniture. Panel 110 can be made from various materials such as fiberglass, wood, plastic, stiff upholstery, other suitable material that can be excited to generate sound, or a combination of materials. In one specific embodiment, panel 110 is made from fiberglass.

Panel 110 can be a single layer of material or can have multiple layers of one or more materials. In one specific embodiment, panel 110 has 3 layers with the middle layer being sandwiched by two outer layers of the same materials. The middle layer can be made from a foam material or other suitable insulating or porous material. The two outer layers can be made from fiberglass.

Figure 1B:
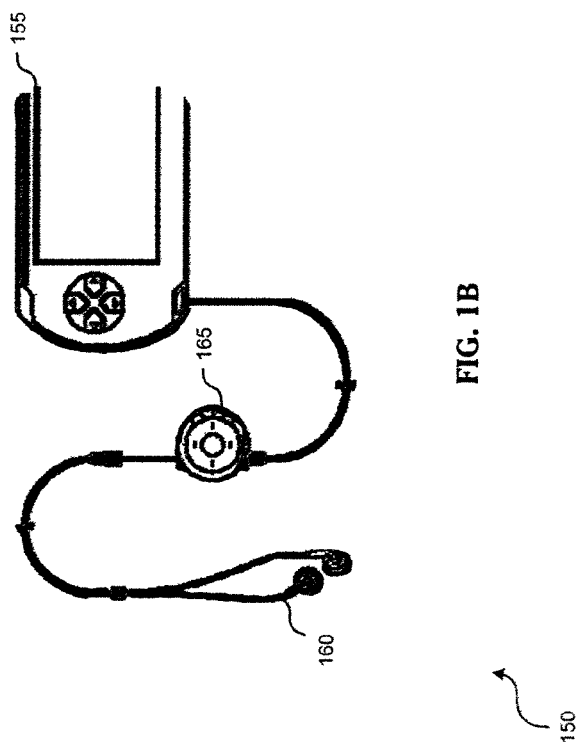

System 100 may also be associated with any other panel or surface that can be excited to generate sound such as, but not limited to panels and specifically the headliners in the interiors of vehicles, such as airplanes, helicopters, trains, and boats for example. This also includes other interior or exterior surfaces of, for example vehicles, buildings or other objects, and specifically panels, including walls, ceilings, floors and children's toys, helmets, and furniture, for example, tables, chairs, sofas and headboards for beds. In vet another embodiment, the panel may comprise, or be separately attached to, one or more of the group consisting of interior door moldings (front and/or rear), package tray, pillar/column/support structures seat backs, dashboard, lift gates (rear doors), trunk, firewall (front or rear), and interior kick panels of a vehicle and specifically a motor vehicle such as an automobile. Although transducer 120 is described as a flat s FIG. 1B shows a consumer device, with an audio output, in which the signal processing method or apparatus can be implemented according to one embodiment of the present invention. Referring now to FIG. 1B, a system 150 includes a consumer device 155, a headset 160, and an in-line signal processing unit 165. Consumer device 155 can be any electronic game, music, video, or audio device such as, but not limited to, a radio, TV, computer, a set top box, a home theater system, a Zune, an iPod, a Nintendo DS, a Playstation Portable, or a portable DVD player. In a conventional headset-consumer device system, the sound quality is generally limited by the electronics of device 155 and the quality of headphone 160. In system 150, the sound quality can be enhanced by audio processing unit 165, which is configured to condition and process the audio signal received from consumer device 15. Unit 165 may be, in one embodiment of the present invention, an add-on device to the consumer device 155, or it may be completely integrated within the consumer device 155. Unit 165 may be of any appropriate size, design or physical configuration, and it may be specifically designed to complement the design, size and/or physical configuration of the consume device 155 and/or headphone 160.

In one embodiment, unit 165 conditions the received audio signal by adjusting the overall loudness of the signal. Alternatively, unit 165 can adjust the operation setting of various electronic components such as filters and gain controller based on a characteristic such as, but not limited to, loudness of the audio signal. The operation setting can be a threshold setting of the filter or the gain controller. Once the audio signal is conditioned or one or more electronic components are re-adjusted, unit 165 can process the audio signal to enhance overall audio quality of headset 160 to near studio quality.

In one embodiment, audio processing unit 170 is preloaded with various equalizer settings for a variety of speaker and headset types. For example, unit 170 may have a preloaded equalizer setting for various audio play back devices such as, but not limited to, built-in speakers of a flat panel television, speaker systems of various manufacturers, and headset by model and manufacturers, etc. Unit 170 may also include a user interface that enables the user to select the appropriate audio play back device. In this way, unit 170 can set the equalizer settings specific to the selected play back device.

Figure 1C:
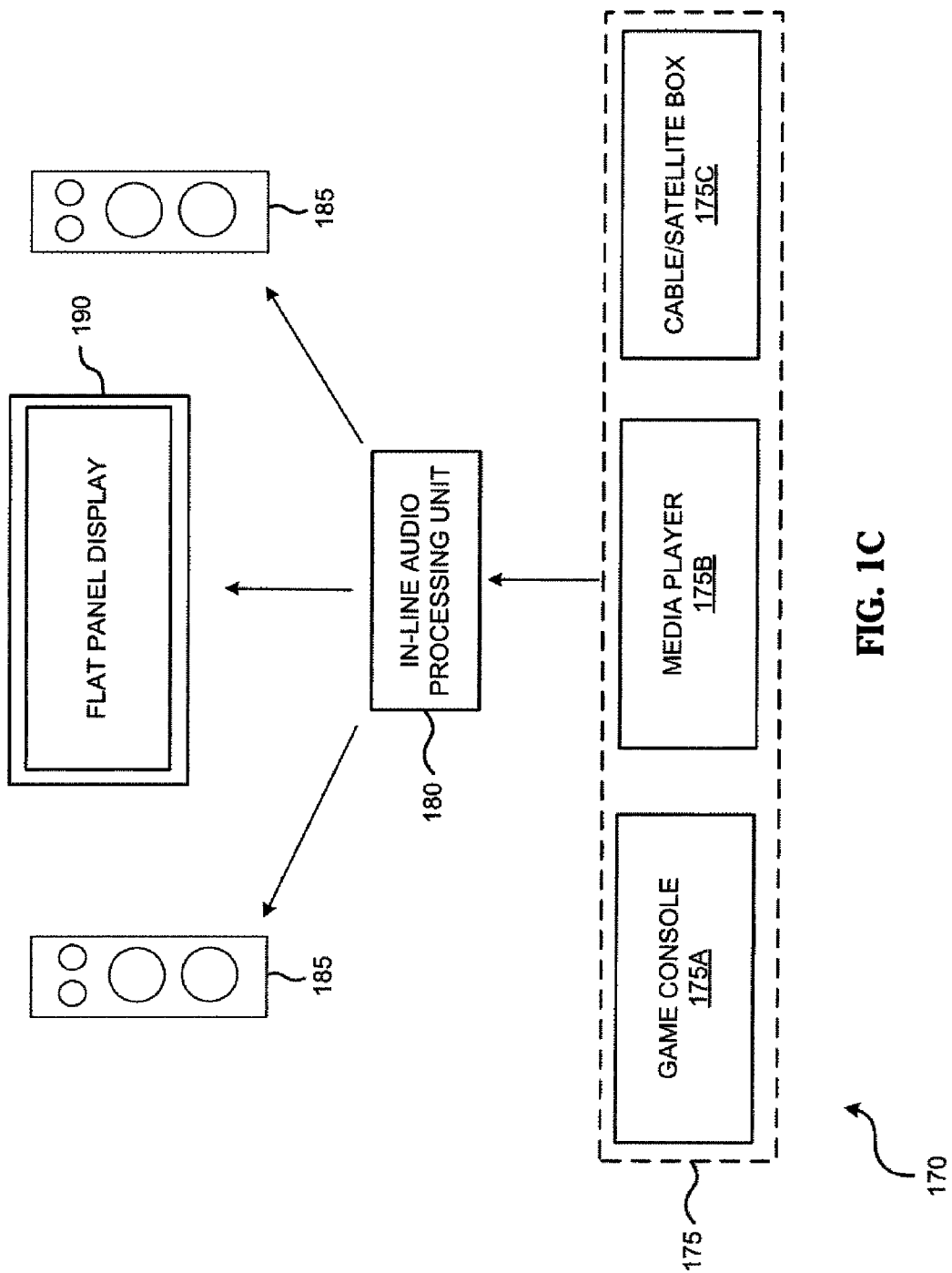

FIG. 1C shows an exemplary system 170 where the signal processing method and apparatus can be implemented according to one embodiment of the present invention. Referring now to FIG. 1C, system 150 includes media devices 175, in-line audio processing unit 180, speakers 185, and display device 190. Media devices 175 can be a game console 175A, a media player (e.g., DVD, VHS, HD-DVD, Blu-Ray player), and a cable or satellite box 175C. The media can be streamed or stored on any of these devices and can playback to speakers 185 and display 190. Conventionally audio signals from media device 175 are directly inputted into speaker 185 or display 190, but the sound quality is heavily dependent upon the quality of speaker 185 and the built-in speakers of display 190. In contrast near studio-quality sound can be achieved by coupling audio processing unit 180 in-line with the audio source and the speakers 185 or display 190.

In-line processing unit 180 is similar to processing unit 165 and may include one or more features of unit 165. Since processing unit 180 is generally designed for home use, unit 180 may contain various input/output interfaces such as, but not limited to standard stereo input, optics, and HDMI. Media device 175 can be connected to unit 180 via any of these audio interfaces. In a specific embodiment, media device 175 is connected to unit 180 via a HDMI connection. In this embodiment, unit 180 can be configured to extract the audio signal from the HDMI input. The extracted audio signal can then be processed using various processing methods described below. Unit 180 can also be connected to display 190 via the same connection type connected at the input (i.e., the HDMI input from media 175). Alternatively, the connection from unit 180 to speaker 185 and display 190 can be different (e.g., a standard speaker wire is used).

From time-to-time, the present invention is described herein in terms of these example environments. Description in terms of these environments is provided to allow the various features and embodiments of the invention to be portrayed in the context of an exemplary application. After reading this description, it will become apparent to one of ordinary skill in the art how the invention can be implemented in different and alternative environments.

Figure 2:
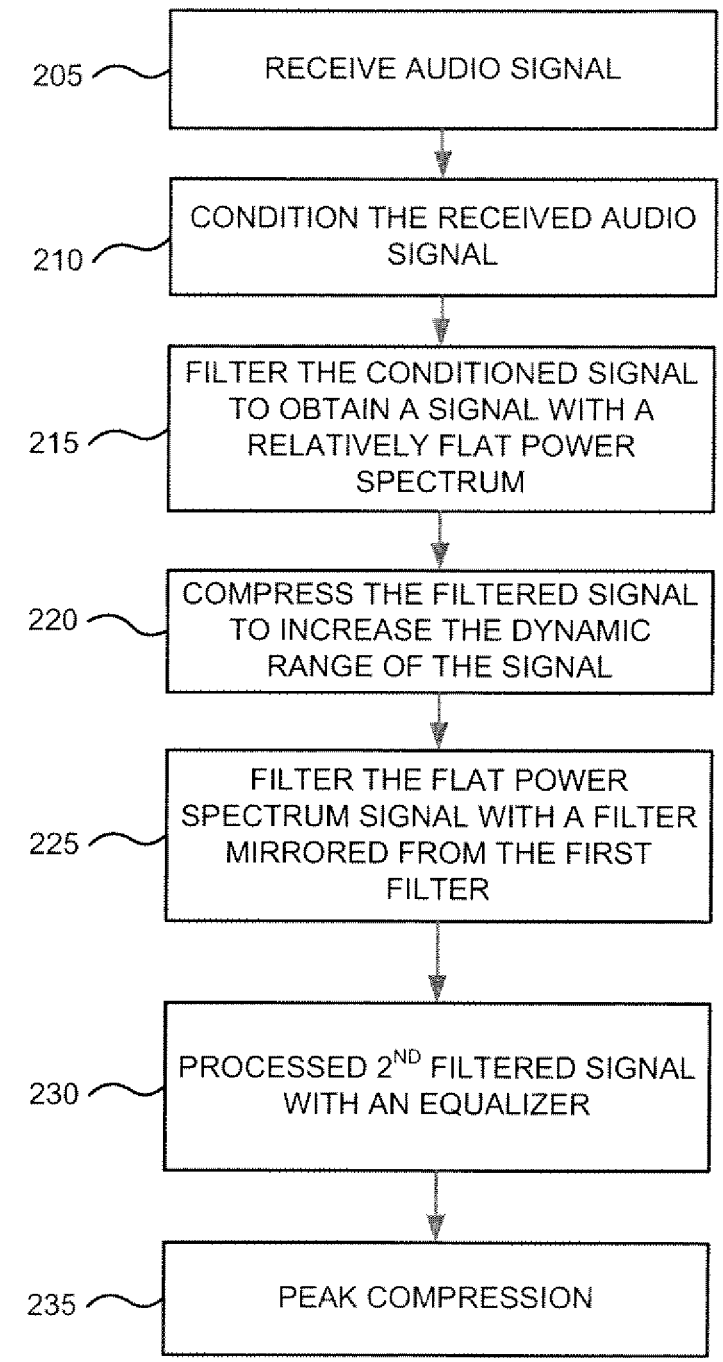
FIG. 2 illustrates a flow chart of a signal processing method according to one embodiment of the present invention.

FIG. 2 illustrates a process flow of an audio processing method 200 according to one embodiment of the present invention. In one embodiment, audio processing method 200 is executable on a computer chip, such as, without limitation, a digital signal processor (DSP). The DSP may have one or more software and hardware modules working alone or in combination to execute method 200. In one embodiment, such a chip may be one part of a larger device, such as, without limitation, a radio, MP3 player, game station, cell phone, television, computer, or unit 165. Referring now to FIG. 2, method 200 starts at step 205 where an audio signal is received from a device such as device 155 or from an audio system of vehicle 105.

In step 210, the received audio signal can be conditioned prior to the main processing portion of method 200. In one embodiment, the received signal is filtered to limit low frequencies that can be found the audio signal. The received signal can also be gain adjusted to modify the gain level of the audio signal. This step may include a loudness adjusting step to compensate for loudness variations caused by the volume control of the output device. In this way, the conditioned signal has a constant loudness and/or gain level before the main processing portion of method 200 begins. Step 210 may include one or more of the above filtering, gain and loudness adjusting steps discussed above. Additionally, the loudness adjusting step will be discussed in further detail in FIG. 3.

In one embodiment, the received signal is filtered using a pre-input high pass filter. The cut off point of the pre-input high pass filter can be adjusted from 20 to 200 Hz. In one embodiment, the pre-input filter has a roll off of 20 dB per octave.

In one embodiment, the received signal is gain adjusted by computing the loudness level of the received signal using a leaky integrator, which generally calculates a slow-moving envelop based on an integrated version of the rectified signal. Once the overall loudness is determined, the received signal can be gain boosted or reduced using, a expander or limiter, respectively, based on a threshold or reference loudness. In this way, the signal outputted at this stage can have a relatively constant loudness with respect to a reference or threshold level regardless of the loudness of the source (e.g., regardless of the volume of the audio source). In one embodiment, step 210 is optional.

In step 215, the received signal or the conditioned signal from step 210 is filtered to obtain a signal having a generally flat power spectral density, meaning the power or energy distribution in all frequencies is equal. Prior to step 215, the energy spectral density of a signal from an audio source is not equally distributed in all frequencies. The energy spectral density of the raw audio signal from step 205 is not generally flat, instead, it increases or decreases with respect to a frequency range of the audio signal.

In one embodiment, step 215 flattens the power spectral density of the audio signal received from step 205 by using a high and low shelving filter set combination. Each of the filters can boost or reduce the signal up to about 12 dB. In one embodiment, the crossover point between the high and low frequency filters is located at about 1000 hertz. In one embodiment, the low shelving filter, leaves all of the frequencies above the corner frequency unaltered, while boosting or cutting all frequencies below the corner frequency by a fixed amount (e.g x dB). In one embodiment, the response of the low shelving filter in cut mode is at −3 dB at the corner frequency, whereas a low-shelving filter in boost mode is specified such that the response at the corner frequency is at G−3 dB namely 3 dB down from maximum boost. In step 215, the low shelving filter can be implemented using a weighted sum of high-pass and low-pass filters.

In general, the raw audio signal received from step 205 can contain a pink noise portion and a white noise portion. The pink noise portion generally can span the entire frequency spectrum of the raw audio signal. Pink noise has equal energy in each octave. The white noise portion may also span the entire frequency spectrum of the raw audio signal, however, while noise contains equal energy at all frequencies. For pink noise, lower frequencies contain more energy than in higher frequencies.

In one embodiment, the low and high shelving filters are configured to flatten the energy spectral density from the pink and white noise portion of the raw audio signal. The filters may be configured to remove more energy from lower frequencies of the raw audio signal. Typically, more energy is stored in the lower frequencies of the pink noise portion of an audio signal. In a specific embodiment, in step 210, the low audible bass portion of the raw audio signal (taken at 100 Hz) is reduced by about 10 dB. Similarly, the high audible treble portion (taken at 8 kHz) is increased by about 8 dB, and the portions in between are reduced or enhanced in a linearly proportional manner, i.e., the increase is a substantially linear function of frequency. In this way, the high-low shelving filter set produces a generally flat energy spectral density across a wide range of frequencies (e.g., low audible bass to high audible treble frequencies).

In step 220, the filtered signal is compressed to increase the dynamic range of the received audio signal using a gain controller or compressor. In one embodiment the compressor is configured to alter the dynamic range of a signal by reducing the ratio between the signal's peak level and its average level. A compressor is characterized by four quantities: the attack time, Tatt, the release time, Trel, the threshold, KT, and the ratio, r. In brief, the envelope of the signal is tracked by algorithm that gives a rough "outline" of the signal's level. Once that level surpasses the threshold, KT for a period of time equal to Tatt, the compressor decreases the level of the signal by the ratio r dB for every dB above KT. Once the envelope of the signal falls below KT for a period equal to the release time, Trel, the compressor stops decreasing the level.

In step 225, the compressed signal from step 220 can be further filtered in order to convert the signal having a flat energy spectral density to a signal having a full frequency response (i.e., energy spectral density is no longer flat). On a high level, the signal with a flat energy spectral density is reconstructed into a signal with a flat frequency response and having a variable energy spectral density. In one embodiment, this can be accomplished using a set of low-high shelving filter that is a mirror image of the low-high shelving filter set in step 215. In one embodiment, all frequencies below the corner frequency are left unmodified, whereas the frequencies above the corner frequency are boosted or cut by 'x' dB. Similar to the first low-high shelving filter set in step 215) the second low-high filter set has a crossover point at 1000 Hz. Each of the filters can boost or reduce the sisal level by 12 dB.

In step 230, the reconstructed signal from step 225 is further processed by an equalizer. The operational settings of the equalizer can be manually set by an audio engineer. This stage allows an audio engineer finely tune and enhance the output signal based on various factors such as, but not limited to, the physical limitation of the speakers and the environment. In one embodiment, the equalizer is a 10 band fully parametric equalizer. Each of the filters in the equalizer can boost or reduce the signal level by 18 dB or −12 dB, respectively. In one specific embodiment, the 'Q' of the band can be individually adjusted from 0.4 to 8. As mentioned, audio processing unit 170 may be preloaded with various equalizer settings for a variety of speaker and headset types. Unit 170 may also include a user interface that enables the user to select the appropriate audio play back device. For example, the user may enter a specific code for a particular headset to calibrate the equalizer of unit 170 for optimum near-studio audio quality output. The code can be included along with the operational manual of unit 170 or can be look up via the manufacturer of unit 170 website.

In step 235, the output signal from step 230 is further compressed. In one embodiment a split band compressor is used. The split band compressor may comprise a low frequency compressor that operates in the range of 0 to 500 Hz and a high frequency compressor that operates in the range of 10 k to 20 k Hz. In one specific embodiment, each compressor has the following specifications: threshold of 0 to −52 dB; ratio of 1:1 to 800.1; make up gain of +12 dB to 90 dB; attack time of 0 to 99 ms; and release time of 0 to 495 ms. In one embodiment, one of the main functions of step 235 is to prevent the speaker or headset to operate in a range that exceed its physical design limitations. Although not shown, the output signal from step 235 can be further gain adjusted to compensate for any loudness/gain adjustment that was done in step 210.

Figure 3:
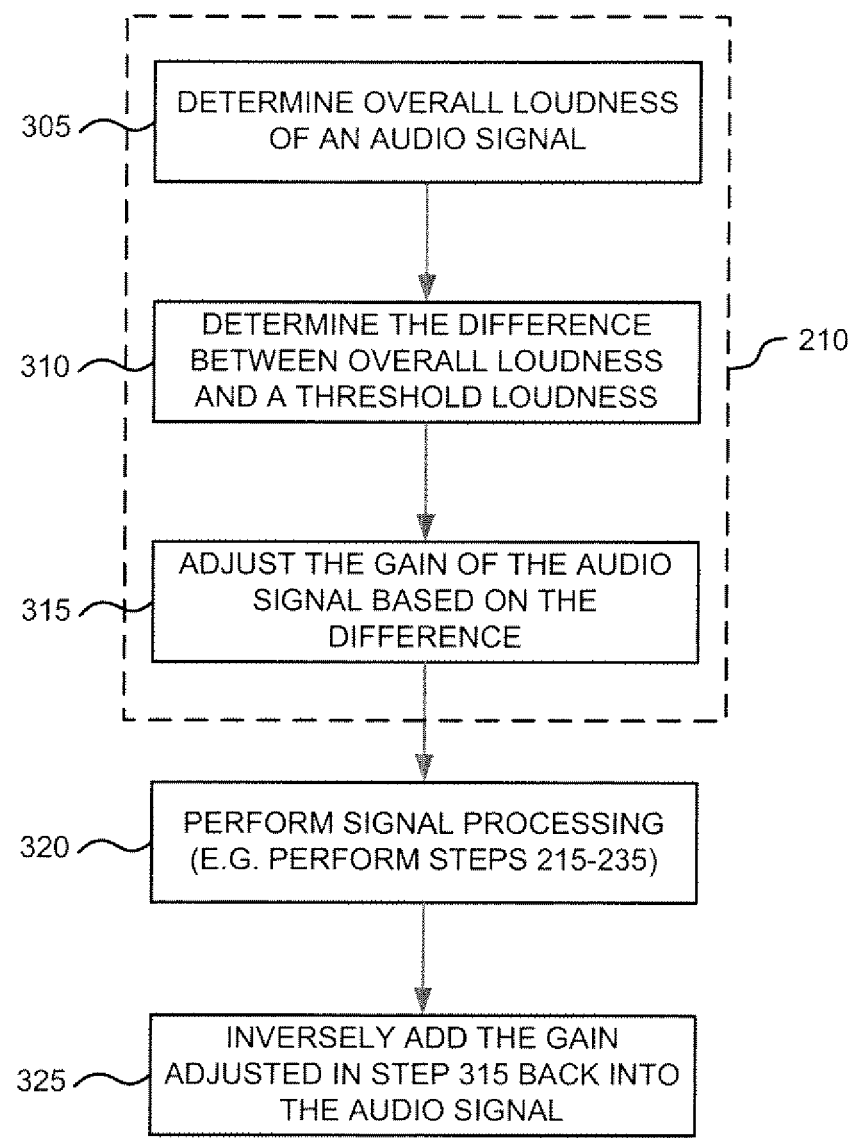
FIG. 3 illustrates a flow chart of a signal processing method according to one embodiment of the present invention.

FIG. 3 illustrates a detailed process flow of a portion of step 210 according to one embodiment of the present invention. Referring now to FIG. 3, a method 300 for adjusting the loudness of an audio signal is shown. Method 300 is typically used in a system where the loudness of the audio source can be varied by a volume adjustment such as an audio output from a portable music or video player or a portable gaming device. In one embodiment, audio processing unit 165 (shown in FIG. 1) is configured to work with an audio source having a prescribed gain or loudness value when performing steps 215-235 as described in FIG. 2. Thus, when the volume is substantially lowered or raised, downstream signal processing done by unit 165 may be distorted because the loudness is not at the expected level. Thus, method 300 can be used to generate an output signal with a predetermined loudness regardless of the volume of the input audio signal. In this way, unit 165 may perform steps 215-235 as designed and without added distortion.

In step 305, the overall loudness of the received signal from step 205 is determined. As mentioned, this may be done with a leaky integrator. Other methods to determine loudness can also be used.

In step 310, the determined loudness is compared with a threshold loudness, which is set by engineer. The threshold loudness is typically based on the filters and the gain stages inside of audio processing unit 165.

In step 315, the gain of the raw audio signal is adjusted based on the comparison done in step 310. If the loudness is above the threshold, the gain of the audio signal is reduced. In one embodiment, the gain of the audio signal is reduced using a limiter. Other gain reduction methods can also be used. If the loudness is below the threshold, the Lain of the audio signal is increased. In one embodiment, the gain is increased with an expander. Other gain boosting methods can also be used.

After the gain is adjusted in step 315, the signal can be further processed in step 320. For example, the signal can be further processed using steps 215 to 235 of method 200. In a step 325, the gain add or subtracted from the audio signal in step 315 is subtracted or added back in by an amount that is exactly inverse to the amount taken or added in step 315. In this way, the original volume control is mimicked at the end of method 300.

Figure 4:
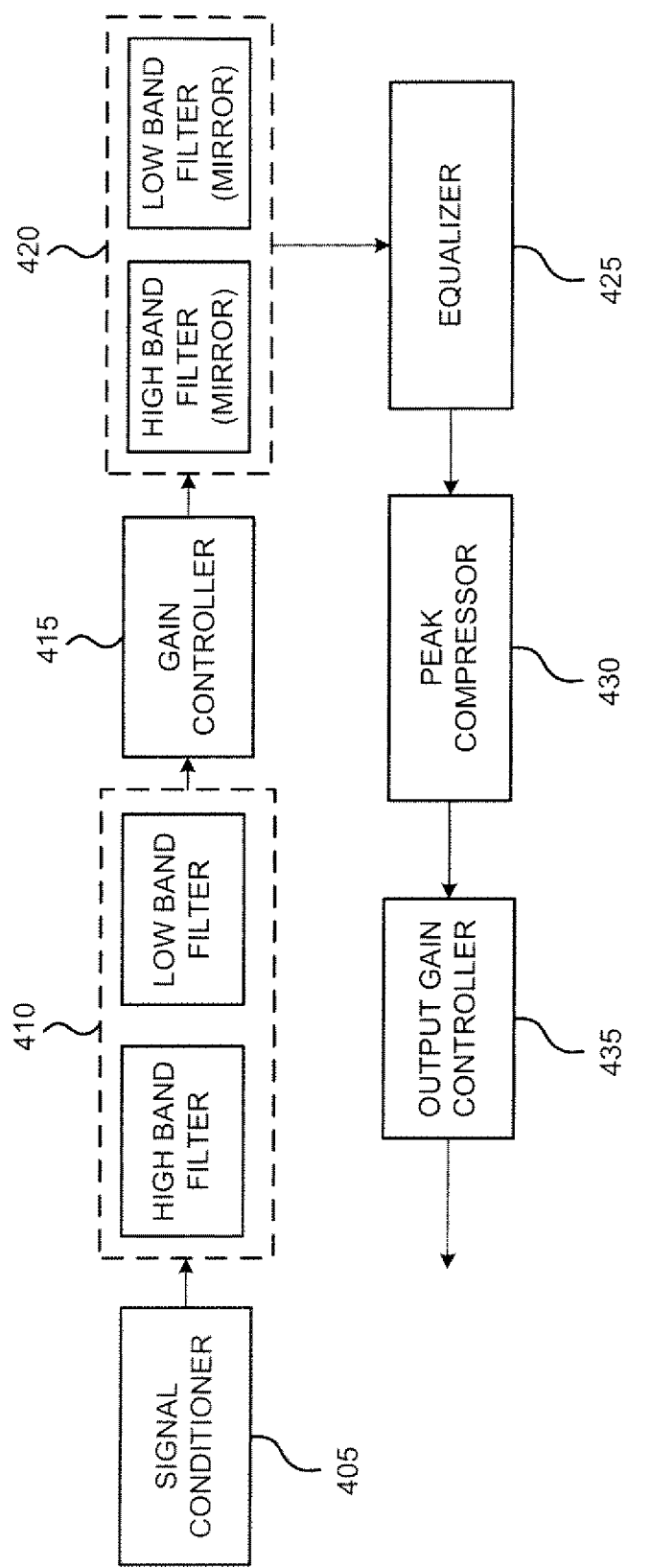
FIG. 4 illustrates a flow chart of a signal processing method according to one embodiment of the present invention.

FIG. 4 illustrates an example digital signal process flow of a method 400 according to one embodiment of the present invention. Referring now to FIG. 4, method 400 includes the following stages: a signal conditioning stage 405, first low-filtering high shelve filtering stage 410, a first compressor stage 415, a second low-high shelve filtering stage 420, an equalizing 425, a second compressor stage 430, and an output gain adjustment stage 435.

Similar to method 200, methods 300 and 400 are executable on a computer chip, such as, without limitation, a digital signal processor, or DSP. In one embodiment, such a chip may be one part of a larger audio device, such as, without limitation, a radio, MP3 player, game station, cell phone, television, computer, or public address system. In one such embodiment, digital signal processing method 100 may be performed on the audio signal before it is outputted from the audio device. In one such embodiment, digital signal processing method 400 may be performed on the audio signal after it has passed through the source selector, but before it passes through the volume control.

In one embodiment, conditioner stage 405 provides a desired amount of gain in order to bring the input audio signal to step 410 to a level that will prevent digital overflow at subsequent internal points in digital signal processing method 100.

In one embodiment, each of the low-shelf filters in filter stages 410 and 420 is a filter that has a nominal gain of 0 dB for all frequencies above a certain frequency termed the corner frequency. For frequencies below the corner frequency, the low-shelving filter has a gain of ±G dB, depending on whether the low-shelving filter is in boost or cut mode, respectively.

In FIG. 4, the compressed audio signal from stage 415 is applied to the input of gain controller stage 420. Gain controller stage 420 provides a degree of amplification which is inversely related to signal amplitude. Low amplitude portions of the signal are provided with higher gain amplification than high amplitude portions with the result that the dynamic range of represented sounds is lowered. (Quiet sounds would be raised; loud sounds would be lowered). Preferably the dynamic range is reduced to 10 dB or less. A variety of compressor circuits are known.

After compression of the electrical audio signal at stage 415, the signal received at stage 420 is subjected to "mirror image" equalization in mirror image filtering stage 420. At this stage, the bass portion of the signal is increased, while the treble portion is reduced. Preferably the low audible bass portion (100 Hz) is increased about 10 dB and high audible treble portion (10 kHz) is reduced about 8 dB. The intermediate portions of the signal are reduced as a substantially linear function of frequency. The equalizer 415 and the "mirror image" equalizer or gain controller 415 are ideally chosen so that they have equal and opposite affects.

After equalization, compression and mirror image equalization, the processed audio signal is applied to speaker system or headset 160 either directly or through a multiple-band equalizer (not shown in FIG. 1) for sound presentation. The speaker system can consist of small speakers (having magnets smaller than 10 oz), for presentation of sound in a high-noise environment. Because the bass portion was reduced before compression and enhanced after compression the sound presented by the speakers has a spectrum rich in bass tones and free of the muffling effect encountered in conventional compression. And because the dynamic range is reduced by compression, the sound can be presented within the limited volume range between the 80 dB noise floor and the 10 dB threshold of unpleasant sensation.

Also shown as parts of the preferred circuit are an optional power supply 20 and a 10-band graphic equalizer 21 for a specific speaker assembly. The equalizer 21 is disposed at the output of mirror image equalizer 13.

The signal processor described herein is designed to accommodate the conversion of music composition and movie sound tracks with wide dynamic ranges to a very narrow dynamic range without distorting or altering the original work. It is particularly suited for playing music or movies in high ambient noise environments such as aircraft or boats. Additional applications include shopping malls, performance theaters, automobiles, cabaret clubs as well as high noise environment where music or sound needs to be reproduced; e.g. amusement parks and racetracks.

By using equalization and compression in this fashion, the control of the frequency response of the program materials can be altered to such a degree that it can cause a transducer to pass the sound through conventional boat and aircraft interiors without exposing the transducer to the acoustic environment.

Unless defined otherwise, all technical and scientific terms used herein have the same meaning as is commonly understood by one of ordinary skill in the art to which this invention belongs. All patents, applications, published applications and other publications referred to herein are incorporated by reference in their entirety. If a definition set forth in this section is contrary to or otherwise inconsistent with a definition set forth in applications, published applications and other publications that are herein incorporated by reference, the definition set forth in this section prevails over the definition that is incorporated herein by reference.

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Figure 5:
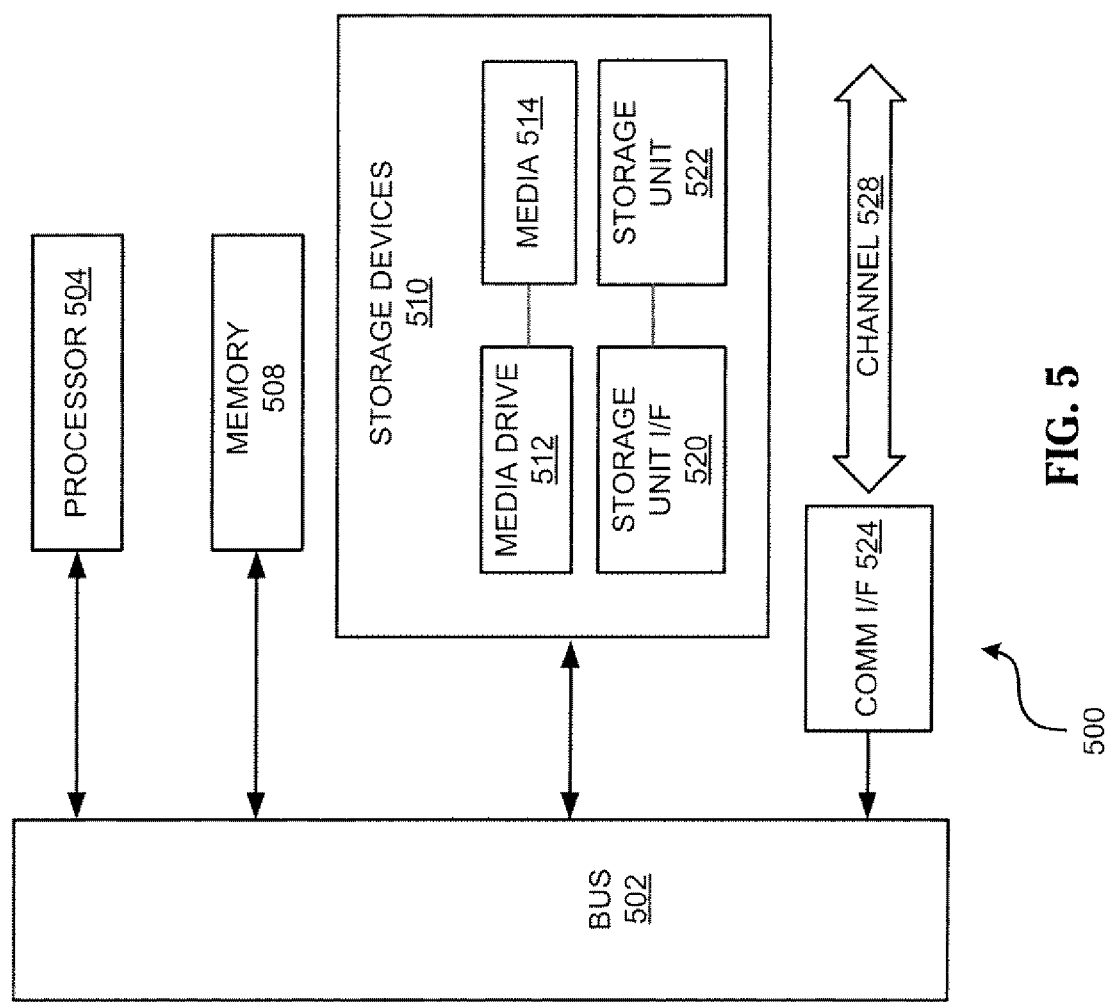
FIG. 5 illustrates an exemplary computer system in which the signal processing method according to one embodiment can be implemented.

As used herein, the term module might describe a given unit of functionality that can be performed in accordance with one or more embodiments of the present invention. As used herein, a module milt be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations aid permutations. Even though various features or elements of functionality may be individually described or embodied as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example-computing module is shown in FIG. 5. Various embodiments are described in terms of this example-computing module 500. After reading this description, it will become apparent to a person skilled in the relevant art how to implement the invention using other computing modules or architectures.

Referring now to FIG. 5, computing module 500 may represent, for example, computing or processing capabilities found within desktop, laptop and notebook computers; handheld computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 500 might also represent computing capabilities embedded within or otherwise available to a given device. For example, a computing module might be found in other electronic devices such as, for example, digital cameras, navigation systems, cellular telephones, portable computing devices, modems, routers, WAPs, and other electronic devices that might include some form of processing capability.

Computing module 500 might include, for example, one or more processors or processing devices, such as a processor 504. Processor 504 might be implemented using a general-purpose or special-purpose processing engine such as, for example, a microprocessor, controller, or other control logic. In the example illustrated in FIG. 5, processor 504 is connected to a bus 502 or other communication medium to facilitate interaction with other components of computing module 500.

Computing module 500 milt also include one or more memory modules, referred to as main memory 508. For example, preferably random access memory (RAM) or other dynamic memory, might be used for storing information and instructions to be executed by processor 504. Main memory 508 might also be used for storing temporary variables or other intermediate information during execution of instructions to be executed by processor 504. Computing module 500 might likewise include a read only memory (ROM) or other static storage device coupled to bus 502 for storing static information and instructions for processor 504.

The computing module 500 might also include one or more various forms of information storage mechanism 51, which might include, for example a media drive 512 and a storage unit interface 520. The media drive 512 might include a drive or other mechanism to support fixed or removable storage media 514. For example, a hard disk drive, a floppy disk drive a magnetic tape drive, an optical disk drive, a CD or DVD drive (R or RW), or other removable or fixed media drive. Accordingly, storage media 514, might include for example, a hard disk, a floppy disk, magnetic tape, cartridge, optical disk, a CD or DVD, or other fixed or removable medium that is read by, written to or accessed by media drive 512. As these examples illustrate, the storage media 514 can include a computer usable storage medium having stored therein particular computer software or data.

In alternative embodiments, information storage mechanism 510 might include other similar instrumentalities for allowing computer programs or other instructions or data to be loaded into computing module 500. Such instrumentalities might include, for example, a fixed or removable storage unit 522 and an interface 520. Examples of such storage units 522 and interfaces 520 can include a program cartridge and cartridge interface, a removable memory (for example, a flash memory or other removable memory module) and memory slot, a PCMCIA slot and card, and other fixed or removable storage units 522 and interfaces 520 that allow software and data to be transferred from the storage unit 522 to computing module 500.

Computing module 500 might also include a communications interface 524. Communications interface 524 might be used to allow software and data to be transferred between computing module 500 and external devices. Examples of communications interface 524 might include a modem or softmodem, a network interface (such as an Ethernet, network interface card, WiMedia, 802.XX or other interface), a communications port (such as for example, a USB port, IR port RS232 port Bluetooth interface, or other port), or other communications interface. Software and data transferred via communications interface 524 milt typically be carried on signals, which can be electronic, electromagnetic, optical or other signals capable of being exchanged by a given communications interface 524. These signals might be provided to communications interface 524 via a channel 52S. This channel 528 night carry signals and might be implemented using a wired or wireless medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 508, storage unit 520, media 514, and signals on channel 528. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 500 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method embodiments, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion not an exhaustive or limiting list thereof, the terms "a" or "an" should be read as meaning "at least one," "one or more" or the like; and adjectives such as "conventional." "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or embodimented in the singular, the plural is contemplated to be within the scope thereof unless limitation to the singular is explicitly stated.

The presence of broadening words and phrases such as "one or more," "at least." "but not limited to" or other like phrases in some instances shall not be read to mean that the narrower case is intended or required in instances where such broadening phrases may be absent. The use of the term "module" does not imply that the components or functionality described or embodimented as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method for processing an audio signal comprising:
   determining a loudness value of an audio signal from a device;
   adjusting the loudness value of the audio signal based on a comparison of the determined loudness and a threshold value;
   filtering the adjusted audio signal with a first filter to obtain a relatively flat power spectrum;
   compressing the filtered signal;
   filtering the compressed filtered signal with a second filter mirrored from the first filter to produce an output signal; and
   altering the loudness of the output signal by an amount that is inverse to the amount adjusted to the audio signal based on the comparison.

2. The method of claim 1, wherein adjusting the loudness value comprises increasing the loudness of the audio signal using an expander if the determined loudness is less than the threshold value.

3. The method of claim 1, wherein adjusting the loudness value comprises reducing the loudness of the audio signal using a limiter if the determined loudness is more than the threshold value.

4. The method of claim 1, wherein determining the loudness value comprises using a leaky integrator.

5. The method of claim 1, wherein filtering the compressed signal results in the output signal having a flat frequency response.

6. A method for processing an audio signal comprising:
   determining a loudness value of an audio signal from a device;
   adjusting an operating threshold of a filter and a gain controller such that the filter and the gain controller is not saturated by the loudness of the audio signal;
   filtering the audio signal such that a signal with a flat power spectral density is produced;
   compressing the filtered signal; and
   filtering the compressed signal to obtain a signal having a flat frequency response.

7. A method for processing an audio signal comprising:
   determining a loudness value of an audio signal from a device;
   adjusting an operation setting of a filter or a gain controller based on the loudness value; wherein the operation setting for the filter comprises a center frequency, a cut-off frequency and tap settings, and the operation setting for the gain controller comprises a gain setting;
   filtering the audio signal such that a signal with a flat power spectral density is produced;
   compressing the filtered signal; and
   filtering the compressed signal to obtain a signal having a flat frequency response.

8. A system for audio processing comprising:
   a processor;
   a computer executable program code on a computer readable medium configured to cause the processor to:
   determine a loudness value of an audio signal from a device;
   adjust the loudness value of the audio signal based on a comparison of the determined loudness and a threshold value;
   filter the adjusted audio signal with a first filter to obtain a relatively flat power spectrum;
   compress the filtered signal;
   filter the compressed filtered signal with a second filter mirrored from the first filter to produce an output signal; and
   alter the loudness of the output signal by an amount that is inverse to the amount adjusted to the audio signal based on the comparison.

9. The system of claim 8, wherein the loudness value is adjusted using an expander if the determined loudness is less than the threshold value.

10. The system of claim 8, wherein the loudness value is adjusted using a limiter if the determined loudness is more than the threshold value.

11. The system of claim 8, wherein the loudness is determined using a leaky integration.

12. The system of claim 8, wherein the computer executable program code is further configured to cause the processing device to: filter the adjusted audio signal such that a signal with a flat power spectral density is produced.

13. The system of claim 8, wherein the computer executable program code is further configured to cause the processing device to: compress the filtered signal; and filter the compressed signal to obtain a signal having a flat frequency response.

14. A computer having a computer executable program code on a computer readable medium configured to cause the computer to:
- determine a loudness value of an audio signal from a device;
- adjust an operation setting of a filter or a gain controller based on the loudness value; wherein the operation setting for the filter comprises a center frequency, a cut-off frequency, and tap settings, and the operation setting for the gain controller comprises a gain setting;
- filter the audio signal such that a signal with a flat power spectral density is produced;
- compress the filtered signal; and
- filter the compressed signal to obtain a signal having a flat frequency response.

15. A method for processing an audio signal comprising:
- determining a loudness value of an audio signal from a device;
- adjusting an operation setting of a filter or a gain controller based on the loudness value; wherein the operation setting for the filter comprises a center frequency, a cut-off frequency and tap settings;
- filtering the audio signal such that a signal with a flat power spectral density is produced;
- compressing the filtered signal; and
- filtering the compressed signal to obtain a signal having a flat frequency response.

16. A method for processing an audio signal comprising:
- determining a loudness value of an audio signal from a device;
- adjusting an operation setting of a filter or a gain controller based on the loudness value; wherein the operation setting for the gain controller comprises a gain setting;
- filtering the audio signal such that a signal with a flat power spectral density is produced;
- compressing the filtered signal; and
- filtering the compressed signal to obtain a signal having a flat frequency response.

17. A computer having a computer executable program code on a computer readable medium configured to cause the computer to:
- determine a loudness value of an audio signal from a device;
- adjust an operation setting of a filter or a gain controller based on the loudness value; wherein the operation setting for the filter comprises a center frequency, a cut-off frequency, and tap settings;
- filter the audio signal such that a signal with a flat power spectral density is produced;
- compress the filtered signal; and
- filter the compressed signal to obtain a signal having a flat frequency response.

18. A computer having a computer executable program code on a computer readable medium configured to cause the computer to:
- determine a loudness value of an audio signal from a device;
- adjust an operation setting of a filter or a gain controller based on the loudness value; wherein the operation setting for the gain controller comprises a gain setting;
- filter the audio signal such that a signal with a flat power spectral density is produced;
- compress the filtered signal; and
- filter the compressed signal to obtain a signal having a flat frequency response.

* * * * *